United States Patent
Oh et al.

(10) Patent No.: US 10,395,948 B2
(45) Date of Patent: Aug. 27, 2019

(54) PURGE MODULE JIG AND PURGE MODULE HAVING THE SAME

(71) Applicant: RORZE SYSTEMS CORPORATION, Yongin-si, Gyeonggi-do (KR)

(72) Inventors: Seung Bae Oh, Yongin-si (KR); Young Il Kim, Seongnam-si (KR)

(73) Assignee: RORZE SYSTEMS CORPORATION, Yongin-si, Gyeonggi-Do (KR)

( * ) Notice: Subject to any disclaimer, the term of this patent is extended or adjusted under 35 U.S.C. 154(b) by 177 days.

(21) Appl. No.: 15/628,820

(22) Filed: Jun. 21, 2017

(65) Prior Publication Data

US 2018/0012779 A1    Jan. 11, 2018

(30) Foreign Application Priority Data

Jul. 5, 2016    (KR) .................... 10-2016-0084538

(51) Int. Cl.
| | |
|---|---|
| *H01L 21/683* | (2006.01) |
| *H01L 21/673* | (2006.01) |
| *H01L 21/67* | (2006.01) |
| *H01L 21/02* | (2006.01) |
| *H01L 21/677* | (2006.01) |

(52) U.S. Cl.
CPC ........ *H01L 21/67028* (2013.01); *H01L 21/02* (2013.01); *H01L 21/673* (2013.01); *H01L 21/67393* (2013.01); *H01L 21/67775* (2013.01)

(58) Field of Classification Search
CPC ......... H01L 21/67028; H01L 21/67775; H01L 21/67393; H01L 21/673; H01L 21/02; H01L 21/67389
See application file for complete search history.

(56) References Cited

U.S. PATENT DOCUMENTS

| | | | | |
|---|---|---|---|---|
| 5,988,233 | A  * | 11/1999 | Fosnight | .......... H01L 21/67393 |
| | | | | 141/63 |
| 6,808,352 | B2 * | 10/2004 | Seita | ................. H01L 21/67379 |
| | | | | 414/217.1 |
| 9,257,320 | B2 * | 2/2016 | Fosnight | .......... H01L 21/67775 |
| 9,411,332 | B2 * | 8/2016 | Fosnight | ............ G05B 19/4184 |
| 9,824,907 | B2 * | 11/2017 | Igarashi | ............ H01L 21/67393 |

(Continued)

FOREIGN PATENT DOCUMENTS

| | | |
|---|---|---|
| JP | 2002-76652 | 3/2002 |
| JP | 2006-351619 | 12/2006 |

(Continued)

*Primary Examiner* — Nicolas A Arnett
(74) *Attorney, Agent, or Firm* — Kile Park Reed & Houtteman PLLC (57) ABSTRACT

A purge module jig and a purge module including the purge module jig are provided. The purge module jig and the purge module include a plate having a recessed groove and an opening formed therein, a gas transfer pipe having an elliptical cross section, and a fixing part fixing the plate and the gas transfer pipe with each other, so that leakage of cleaning gas is prevented, thickness thereof is reduced, the interference between the jig and a wafer cassette is reduced, the purge module jig and the purge module can be applied to various load ports of various manufactures, and performance thereof can be improved.

13 Claims, 6 Drawing Sheets

(56) References Cited

U.S. PATENT DOCUMENTS

| | | | |
|---|---|---|---|
| 9,870,936 B2* | 1/2018 | Fosnight | H01L 21/67775 |
| 10,141,210 B2* | 11/2018 | Oh | H01L 21/302 |
| 2004/0237244 A1* | 12/2004 | Suzuki | H01L 21/67126 |
| | | | 15/301 |
| 2006/0177289 A1* | 8/2006 | Bonora | H01L 21/67766 |
| | | | 414/217 |
| 2012/0309286 A1* | 12/2012 | Nakano | H01L 21/67389 |
| | | | 454/305 |
| 2017/0170043 A1* | 6/2017 | Oh | H01L 21/302 |

FOREIGN PATENT DOCUMENTS

| | | |
|---|---|---|
| KR | 10-2016-0009643 | 1/2016 |
| KR | 10-1593386 | 2/2016 |
| WO | 2015/025584 | 2/2015 |
| WO | 2016/047260 | 3/2016 |

\* cited by examiner

PURGE MODULE JIG AND PURGE MODULE HAVING THE SAME

CROSS REFERENCE TO RELATED APPLICATION

This application claims priority from and the benefit of Korean Patent Applications No. 10-2016-0084538, filed on Jul. 5, 2016, which is hereby incorporated by reference for all purposes as if fully set forth herein.

BACKGROUND OF THE INVENTION

Field of the Invention

The present invention relates to a purge module jig and a purge module having the purge module jig, and more particularly to a purge module jig for purging a wafer cassette in which semiconductor wafers are packed by using a gas and a purge module having the purge module jig.

Discussion of the Background

In general, a semiconductor device is formed by depositing various materials on a wafer which is a substrate in a thin film form and patterning the thin film. For this purpose, different processes such as a deposition process, an etching process, a cleaning process, and a drying process are required.

Apparatuses for transferring wafers to perform these steps are widely used. Among them, a load port is widely used to supply wafers contained in a wafer cassette to a semiconductor transfer equipment (EFEM).

On the other hand, if there is foreign substance in the wafer cassette, it may cause defects in the wafer, so that it is purged using gas to remove the foreign substance. Although the initial load port model did not have such a purge function, the newly developed load port solves these problems by adding the function of purging with nitrogen gas ($N_2$).

However, replacing the existing initial load ports with load ports having such a purge function causes a problem of cost.

Furthermore, there are presently various types of wafer cassettes, and when the types of wafer cassettes are changed, there arises a problem that the corresponding load ports must be separately provided.

Accordingly, in the Korean Patent Registration No. 10-1593386 filed by the present applicant (filed under application entitled "PURGE MODULE AND LOAD PORT INCLUDING THE PURGE MODULE"), a purge module is disclosed, which includes a jig detachably installed on a stage of a load port and having a gas inlet for injecting gas into a wafer cassette and a gas outlet for discharging gas from the wafer cassette, a gas control box controlling gas injected into or discharged from the wafer cassette, and pipes connecting the jig and the gas control box.

In the case of the above purge module, the jig provided with the recessed groove formed on the plate and the gas passage formed by using the upper plate has been provided, but there is a limitation to reduce the thickness of the jig in order to provide the gas passage. In addition, there is a problem that leakage of the gas occurs between the cassette and the contact portions of the upper plate, thereby deteriorating performance.

SUMMARY OF THE INVENTION

Accordingly, it is an object of the present invention to provide a purge module jig with reduced thickness and a purge module including the purge module jig.

Another object of the present invention is to provide a purge module jig capable of preventing gas leakage and a purge module including the purge module jig.

Still another object of the present invention is to provide a purge module jig capable of coping with a load port and a wafer cassette of various manufacturers and a purge module including the purge module jig.

A purge module jig according to an embodiment of the present invention comprises a gas transfer pipe, a plate and a fixing part. The gas transfer pipe comprises a first end connected to an outside and a second end formed opposite to the first end and having a cassette contact part making contact with a cassette for discharging gas from the wafer cassette or injecting gas into the wafer cassette. The plate comprises an opening through which at least a portion of the gas transfer pipe is disposed. The fixing part fixes the gas transfer pipe to the plate.

For an embodiment, the cassette contact part may comprise a packing member located on an upper surface of the cassette contact part and preventing gas leakage.

For an embodiment, the plate may further comprise a recessed groove in which at least portion of the gas transfer pipe is disposed.

For an embodiment, the plate may further comprise an interference preventing opening to prevent interference with the wafer cassette.

For an embodiment, a cross section of the gas transfer pipe may have an elliptical shape.

For an embodiment, the gas transfer pipe may be made of a material having elasticity.

For an embodiment, a number of the gas transfer pipe may be at least one.

For an embodiment, all portions of the gas transfer pipe is disposed in the opening.

For an embodiment, the fixing part may be attached adjacent to the recessed groove.

A purge module according to an embodiment of the present invention comprises a jig, a gas control unit and a pipe. The jig comprises a gas transfer pipe comprising a first end connected to an outside and a second end having a cassette contact part, a plate comprising an opening through which at least a portion of the gas transfer pipe is disposed, and a fixing part fixing the gas transfer pipe to the plate. The gas control unit controls a gas injected into a wafer cassette or discharged from the wafer cassette. The pipe has one end connected to the first end of the gas transfer pipe and other end connected to the gas control unit.

For an embodiment, the cassette contact part may comprise a packing member located on an upper surface of the cassette contact part and preventing gas leakage.

For an embodiment, a cross section of the gas transfer pipe may have an elliptical shape.

For an embodiment, the plate may further comprise a recessed groove in which at least a portion of the gas transfer pipe is disposed, and the fixing part may be attached adjacent to the recessed groove.

For an embodiment, the purge module may further comprise a connecting member to facilitate connection of the first end of the gas transfer pipe and the pipe.

The purge module jig and the purge module including the purge module jig according to the present invention can be applied to wafer cassettes of various manufacturers without any replacement by reducing the thickness of the purge module jig according to the embodiment of the present invention.

In addition, the purge module jig and the purge module including the purge module jig according to the embodiment of the present invention can prevent gas leakage, thereby enhancing the cleaning effect inside the wafer cassette.

Further, the gas transfer pipe of the purge module jig and the purge module according to the embodiment of the present invention is formed of an elastic material, and the cassette contact part where the packing member is located is positioned in the opening portion, so that abrasion of the packing member is reduced without a separate protective member by moving a predetermined distance down through the opening portion, thereby extending the replacement cycle.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention

DETAILED DESCRIPTION OF THE ILLUSTRATED EMBODIMENTS

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that, although the terms first, second, third etc. may be used herein to describe various elements, components, regions, layers and/or sections, these elements, components, and/or sections should not be limited by these terms. These terms are only used to distinguish one element, component, region, layer or section from another region, layer or section. Thus, a first element, component, or section discussed below could be termed a second element, component, or section without departing from the teachings of the present invention.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

Figure 1:
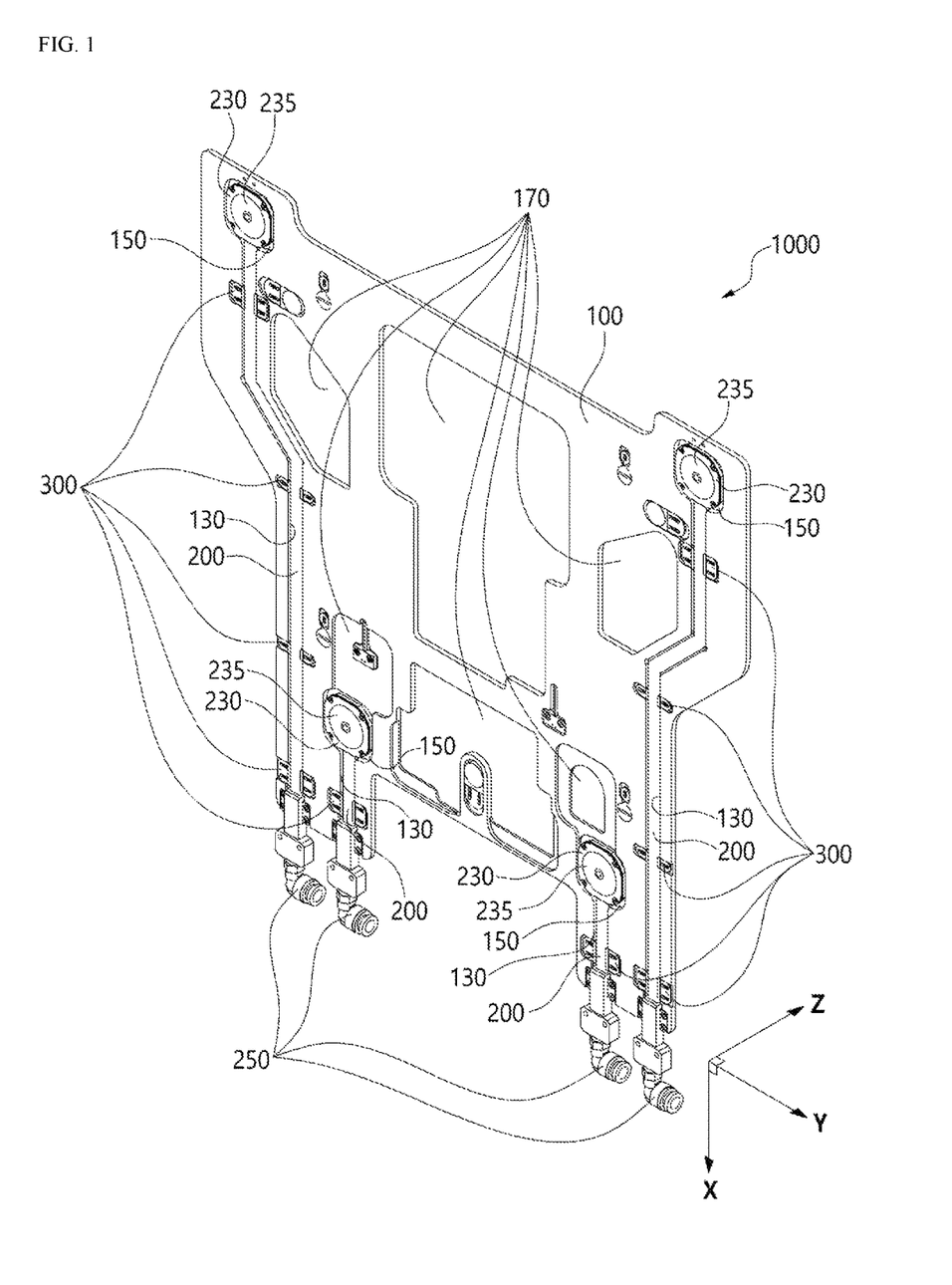
FIG. 1 is a perspective view showing a purge module jig according to an embodiment of the present invention.
Figure 2:
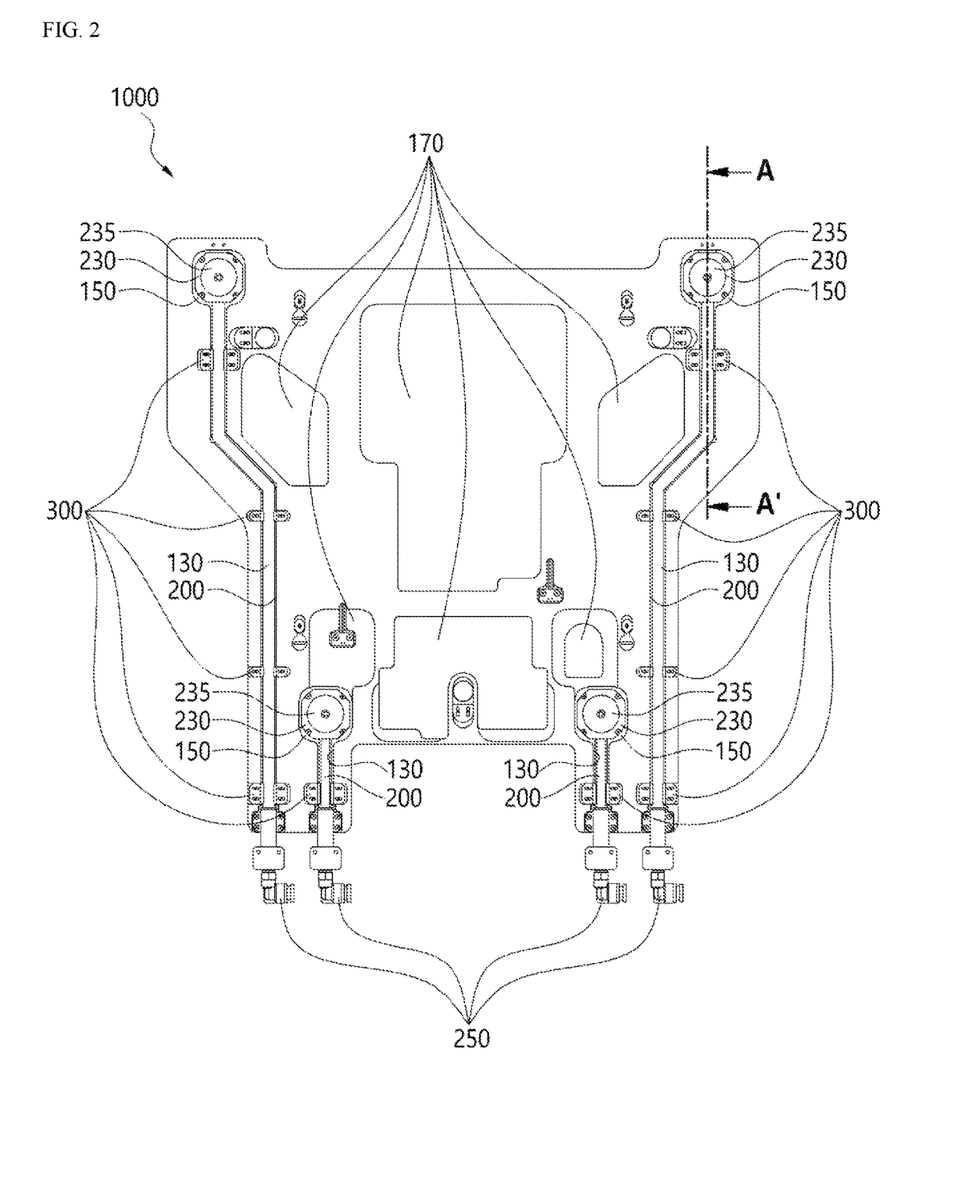
FIG. 2 is a front view showing the purge module jig according to an embodiment of the present invention.
Figure 3:
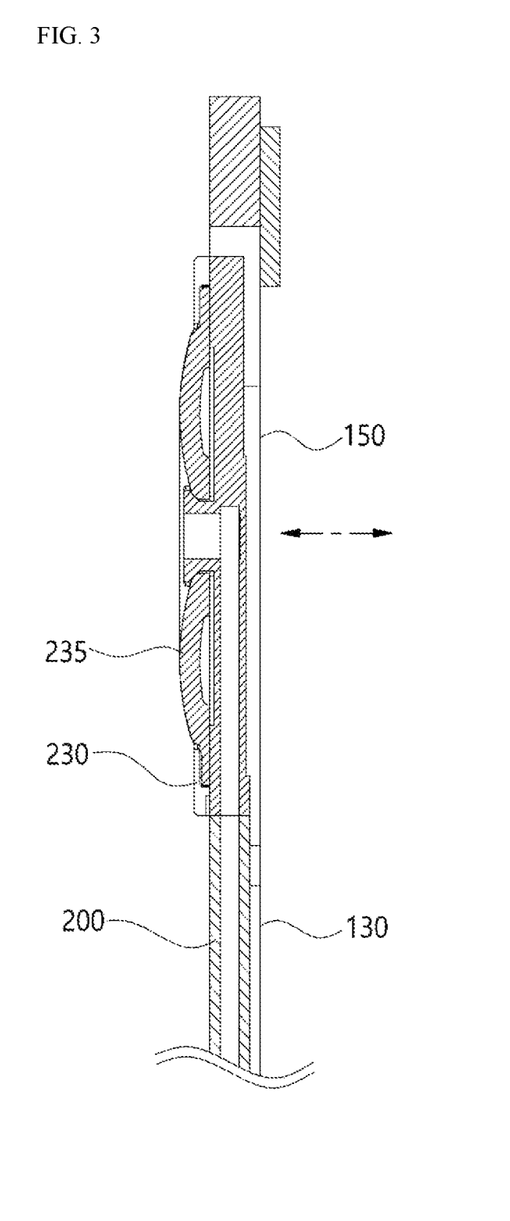
FIG. 3 is a cross-sectional view showing the purge module jig according to an embodiment of the present invention.

FIGS. 1 through 3 are views showing a purge module jig according to an embodiment of the present invention. More specifically, FIG. 1 is a perspective view showing the purge module jig, FIG. 2 is a front view showing the purge module jig, and FIG. 3 is a cross-sectional view taken along line A-A' of FIG. 2.

Referring to FIGS. 1 through 3, a purge module jig 1000 according to an embodiment of the present invention is disposed on a stage (not shown) of a load port (not shown) and removes foreign substances from a wafer cassette (not shown) thereon. In other words, the purge module jig 1000 can be disposed between the upper surface of the load port and the lower surface of the wafer cassette when the wafer cassette is placed on the load port. The purge module jig 1000 may be mountable or detachable from the load port.

Here, the wafer cassette can be defined as a box for loading and transporting a semiconductor wafer. For example, the wafer cassette may be at least one of a FOUP (Front Opening Unified Pod), a FOSB (Front Opening Shipping Box), a cassette, and an open cassette. According to an embodiment, the wafer cassette may be a FOUP.

The purge module jig 1000 may include a plate 100, a gas transfer pipe 200, and a fixing part 300.

The plate 100 may be provided in the shape of a flat plate having a predetermined width. The plate 100 may include a recessed groove 130, an opening 150, and an interference preventing opening 170.

The recessed groove 130 may be formed on the upper surface of the plate 100. More specifically, the number of the recessed groove 130 may be at least two or more, and the recessed groove 130 may be positioned at both ends of the upper surface of the plate 100. The cross-section of the recessed groove 130 may be formed as a U-shape.

At least a portion of the gas transfer pipe 200, which will be described later, may be located in the recessed groove 130. More specifically, the recessed groove 130 may have the same arrangement as the gas transfer pipe 200. Accordingly, the gas transfer pipe 200 can be fixed by the recessed groove 130. The depth of the recessed groove 130 may be equal to or greater than the diameter of the gas transfer pipe 200 with respect to the Z-axis. Accordingly, the gas transfer pipe 200 may be inserted into the recessed groove 130, so that the thickness of the purge module jig 1000 may be reduced.

The opening 150 may be formed on the upper surface of the plate 100 in the same manner as the recessed groove 130 described above.

The opening 150 may be connected to one end of the recessed groove 130.

At least a portion of the gas transfer pipe 200 to be described later may be located in the opening 150. More specifically, the cassette contact part 230, which will be described later, may be positioned in the opening portion 150. The cassette contact part 230 to be described later may be elastic. Accordingly, the cassette contact part 230 can be elastically movable in the vertical direction passing through the opening 150 with respect to the z-axis.

The opening 150 may number at least two or more. According to the embodiment, the opening 150 may be the same in number as the number of the recessed grooves 130.

The interference preventing opening 170 may be provided in the shape of an opening of a predetermined size on the plate 100, like the opening 150 described above.

The interference preventing opening 170 may be configured to minimize the interference ratio with the load port or the wafer cassette. More specifically, when the purge module jig 1000 is placed on the load port or when the wafer cassette is placed on the purge module jig 1000, at least one of the wirings, components, or modules attached to the upper surface of the port or the lower surface of the wafer cassette can be located. Thus, interference between the components may be prevented because the purge module jig 1000 does not make contact with the load port or the wafer cassette.

The gas transfer pipe 200 may be a passage through which the gas moves. The number of the gas transfer pipe 200 may be at least two or more, and in an embodiment, the cross-sectional shape of the gas transfer pipe 200 may be elliptical.

The conventional purge module jig for cleaning the wafer cassette does not require a separate additional structure by providing the gas passage using the recessed groove and the upper plate formed on the plate. However, there has been a gas leakage problem occurring between the cassette and the contact portions of the upper plate, thereby deteriorating performance.

Accordingly, the purge module jig 1000 according to the embodiment of the present invention includes the gas transfer pipe 200, thereby improving the gas leakage to the outside. Also, the purge module jig 1000 having reduced thickness can be provided by forming a recessed groove on the plate and inserting the gas transfer pipe 300 having an elliptical cross-sectional area into the recessed groove. Hereinafter, the gas transfer pipe 200 of the purge module jig 1000 will be described in detail.

The gas transfer pipe 200 may include a first end and a second end. The second end may be formed on the opposite side of the first end.

The first end of the gas transfer pipe 200 may be connected to the outside. For example, the first end of the gas transfer pipe 200 may be connected to the pipe of the purge module described with reference to FIG. 6. At this time, a connecting member 250 may be connected to the first end of the gas transfer pipe 200 for easy fastening with the pipe. For example, the connecting member 250 may be a joint.

The cassette contact part 230 may be formed at the second end of the gas transfer pipe 200.

The cassette contact part 230 may contact one surface of the wafer cassette to evacuate or introduce the gas into the wafer cassette.

More specifically, the cassette contact part 230 may transfer the gas introduced from the first end to the wafer cassette. According to an embodiment, the introduced gas is nitrogen gas ($N_2$), and the pressure of the gas may be 0.5 MPa.

The cassette contact part 230 may drain the gas evacuated from the wafer cassette to the first end. According to an embodiment, the evacuated gas may be nitrogen gas ($N_2$).

As described above, the gas is injected into the wafer cassette, and the injected gas is exhausted, so that foreign matters inside the wafer cassette can be removed. As a result, the rate of occurrence of defects of the wafer due to the contaminants is reduced, and the yield of the wafer can be expected to be improved.

The gas transfer pipe 200 may be positioned on the plate 100.

The gas transfer pipe 200 and the plate 100 may be connected by the fixing part 300 to be described later.

More specifically, the second end of the gas transfer pipe 200 is positioned at the opening 150 formed on the plate 100, and the gas transfer pipe 200 except for the second end may be positioned in the recessed groove 130 formed on the plate 100. In other words, the cassette contact part 230 is located in the opening 150, and the gas transfer pipe 200 except for the cassette contact part 230 may be located in the recessed groove 130.

The gas transfer pipe 200 may be formed by an elastic material. Accordingly, as described above, the cassette contact part 230 positioned in the opening portion 150 can be elastically movable in the vertical direction. Accordingly, when the wafer cassette is positioned on the upper surface of the purge module jig 1000, the cassette contact part 230 is positioned downward in the z-axis direction by elasticity, so that it is possible to reduce the damage of the packing member 235, which will be described later, which is located on the cassette contact part 230. Therefore, the cycle of replacement of the packing member 235 by contact abrasion can be prolonged.

The cassette contact part 230 may include the packing member 235. The packing member 235 may be positioned on the upper surface of the cassette contact part 230. In other words, the packing member 235 may be in contact with the wafer cassette on one side.

The packing member 235 may be made of a material having excellent elasticity. For example, the packing member 235 may include silicone. Accordingly, the packing member 235 is strengthened in adhesion with the wafer cassette, so that gas leakage may be prevented when the gas moves from the cassette contact part 230 to the wafer cassette or from the wafer cassette to the cassette contact part 230.

The fixing part 300 may connect the gas transfer pipe 200 to the plate 100, as described above. More specifically, the fixing part 300 may fix the gas transfer pipe 200 located in the recessed groove 130 to the plate 100. Accordingly, the gas transfer pipe 200 can be fixed to the plate 100 without separating from the recessed groove 130, even when the cassette contact part 230 moves up and down.

The number of the fixing part 300 may be at least one or more, and the fixing part 300 may be provided in the form of a screw bracket.

Figure 4:
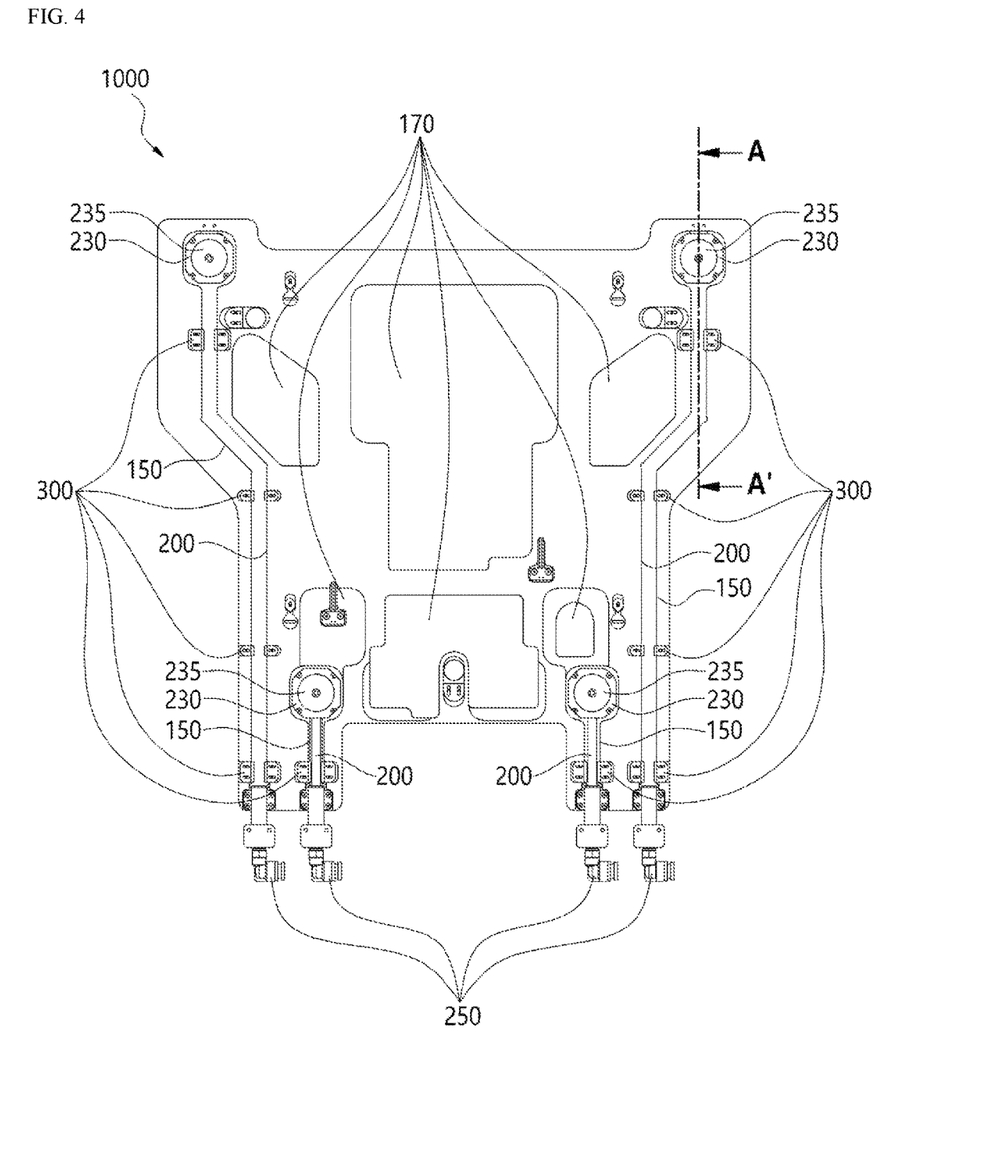
FIG. 4 is a front view showing a purge module jig according to another embodiment of the present invention.
Figure 5:
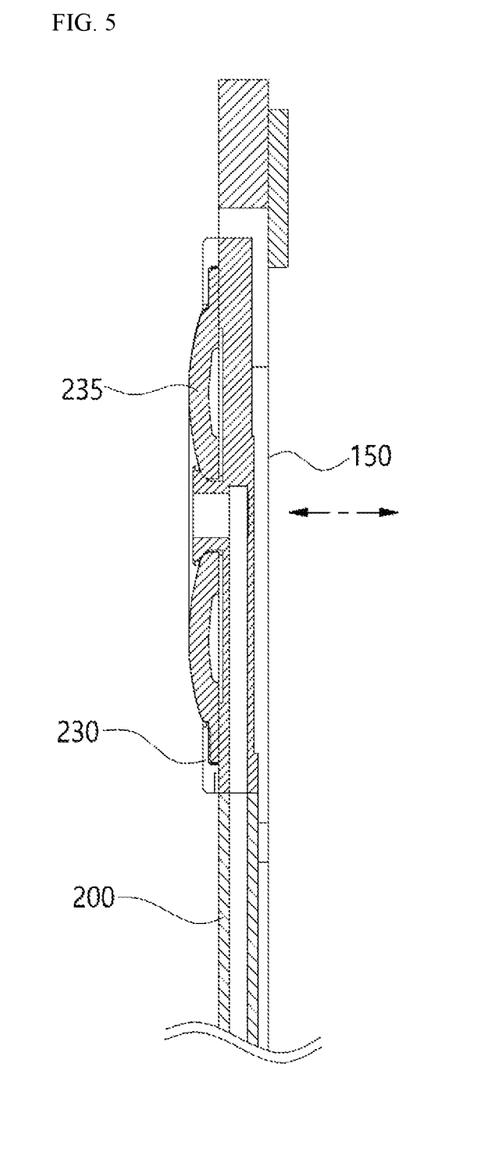
FIG. 5 is a cross-sectional view showing the purge module jig according to another embodiment of the present invention.

FIGS. 4 and 5 are views for explaining a purge module jig according to another embodiment of the present invention. More specifically, FIG. 4 is a front view of the purge module jig, and FIG. 5 is a cross-sectional view taken along line A-A' of FIG. 4.

Referring to FIGS. 1 through 5, a purge module jig 1000 according to another embodiment of the present invention may include a plate 100, a gas transfer pipe 200, and a fixing part 300.

The plate 100 may be provided in the shape of a flat plate having a predetermined width. The plate 100 may include an opening 150.

The opening 150 may be formed on the upper surface of the plate 100. More specifically, the number of the opening 150 may be at least two, and the opening 150 may be positioned at both ends of the upper surface of the plate 100.

The opening 150 may be provided with the gas transfer pipe 200 to be described later. The opening 150 may have the same arrangement as the gas transfer pipe 200.

The plate 100 may have the same thickness as the diameter of the gas transfer pipe 200. Accordingly, even though the gas transfer pipe 200 is separately provided, the gas transfer pipe 200 may be disposed in the opening so that the thickness of the purge module jig 1000 is not increased.

The gas transfer pipe 200 may be a passage through which the gas moves. The number of the gas transfer pipe 200 may have at least two or more, and in an embodiment, the cross-sectional shape of the gas transfer pipe 200 may be elliptical.

The gas transfer pipe 200 may have a first end connected to an outside and a second end formed with the cassette contact part 230.

The cassette contact part 230 may include the packing member 235 located on the upper surface of the cassette contact part 230. The packing member 235 can make contact with the lower surface of the wafer cassette when the wafer cassette is placed thereon.

The packing member 235 may be made of a material having excellent elasticity. For example, the packing member 235 may be silicone. Accordingly, the packing part 235 can improve adhesion with the wafer cassette, thereby preventing the gas leakage to the outside.

The fixing part 300 may connect the plate 100 and the gas transfer pipe 200 with each other. The number of the fixing part 300 may be at least one or more and the fixing part 300 may be provided in the form of a screw bracket.

Hereinbefore, the purge module jig according to the embodiment of the present invention and other embodiments have been described above.

Hereinafter, a purge module including a purge module jig according to an embodiment of the present invention will be described.

Figure 6:
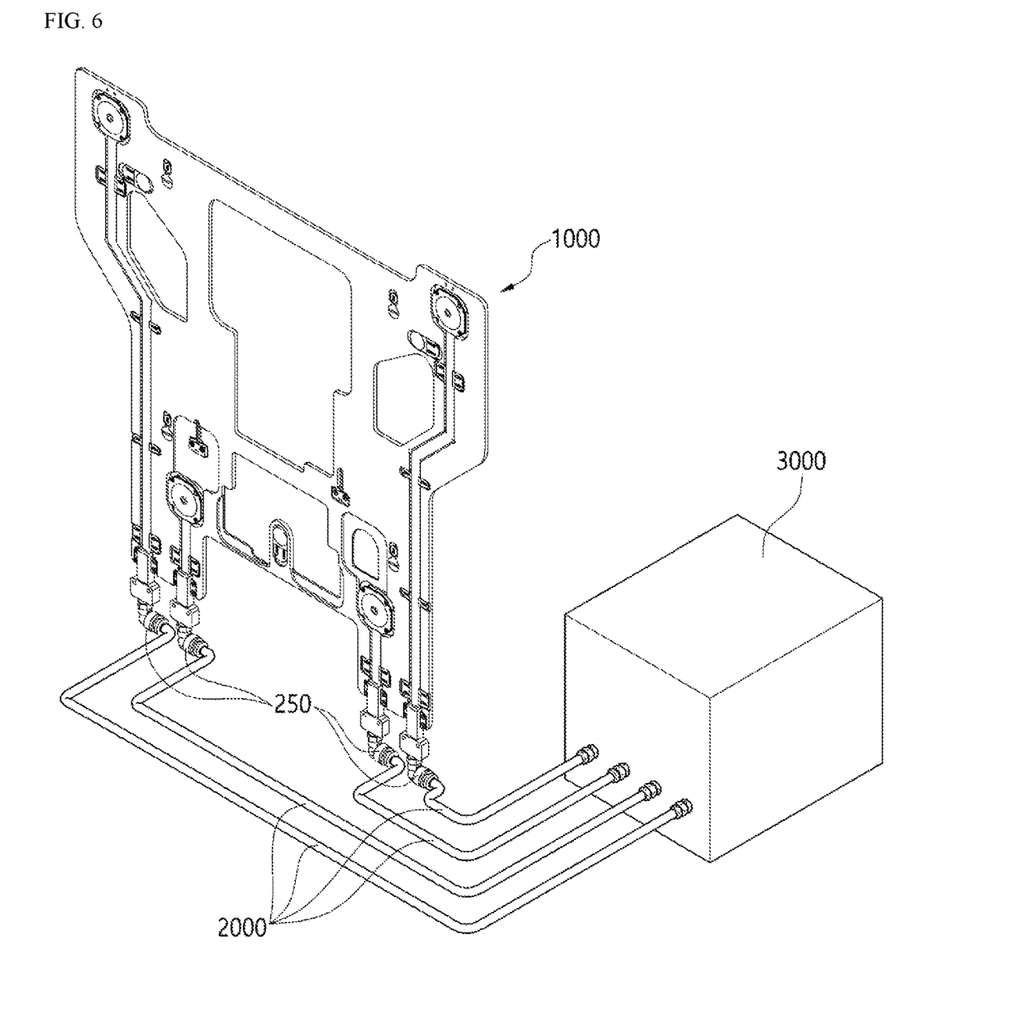
FIG. 6 is a schematic diagram showing a purge module according to an embodiment of the present invention.

FIG. 6 is a schematic diagram showing a purge module according to an embodiment of the present invention.

Referring to FIGS. 1, 2, and 6, a purge module may include a jig 1000, a pipe 2000, and a gas control unit 3000.

The jig 1000 is substantially same as the purge module jig 1000 described with reference to FIGS. 1 and 2, or FIGS. 3 and 4. Therefore, any further explanation will be omitted.

The pipe 2000 to be described later may be connected to the first end of the gas transfer pipe 200. According to an embodiment, a connecting member 250 may be connected to the first end of the gas transfer pipe 200 for easy fastening to the pipe 2000. For example, the connecting member 250 may be a joint.

The gas control unit 3000 can control the gas injected into the gas transfer pipe 200 and the gas discharged from the wafer cassette.

More specifically, the gas control unit 3000 may include a supply control mode and an exhaust control mode.

When the gas control unit 3000 is in the supply control mode, the gas control unit 3000 may inject the gas into the first end of the gas transfer pipe 200 through a gas supply port (not shown). The injected gas may be purged into the wafer cassette via the cassette contact part 230.

When the gas control unit 3000 is in the exhaust control mode, the gas injected into the wafer cassette in the supply control mode is exhausted through the cassette contact unit 230 and the gas exhaust port (not shown) of the gas control unit 3000 to the outside.

Alternatively, the supply control mode and the exhaust control mode may be performed simultaneously. For example, four pipes are disclosed in FIG. 6, and gas may be injected into the cassette through a portion of four pipes, and gas may be exhausted from the cassette through the other portion of the four pipes, simultanesouly.

The gas control unit 3000 may be disposed below the stage of the load port. Accordingly, the space under the stage can be utilized, so that there is no need to secure additional space, and the operation of combining the purge module of the present invention to the conventional load port without purge function may be facilitated.

The purge module jig according to the present invention and the purge module including the same have been described above. The purge module jig and the purge module include a plate having a recessed groove and an opening formed therein, a gas transfer pipe having an elliptical cross section, and a fixing part fixing the plate and the gas transfer pipe with each other, so that leakage of cleaning gas is prevented, thickness thereof is reduced, the interference between the jig and a wafer cassette is reduced, the purge module jig and the purge module can be applied to various load ports of various manufactures, and performance thereof can be improved.

It will be apparent to those skilled in the art that various modifications and variation may be made in the present invention without departing from the spirit or scope of the invention. Thus, it is intended that the present invention cover the modifications and variations of this invention provided they come within the scope of the appended claims and their equivalents.

What is claimed is:

1. A purge module jig comprising:
    a gas transfer pipe comprising a first end connected to an outside and a second end formed opposite to the first end and having a cassette contact part making contact with a wafer cassette for discharging gas from the wafer cassette or injecting gas into the wafer cassette;
    a plate comprising an opening through which at least a portion of the gas transfer pipe is disposed, the opening being formed on an upper surface of the plate; and
    a fixing part fixing the gas transfer pipe to the plate,
    wherein the plate further comprises a recessed groove in which at least a portion of the gas transfer pipe is disposed, the recessed groove being formed on the upper surface of the plate, and
    wherein the opening is connected to one end of the recessed groove.

2. The purge module jig of claim 1, wherein the cassette contact part comprises a packing member located on an upper surface of the cassette contact part and preventing gas leakage.

3. The purge module jig of claim 1, wherein the plate further comprises an interference preventing opening to prevent interference with the wafer cassette.

4. The purge module jig of claim 1, wherein a cross section of the gas transfer pipe has an elliptical shape.

5. The purge module jig of claim 1, wherein the gas transfer pipe is made of a material having elasticity.

6. The purge module jig of claim 1, wherein a number of the gas transfer pipe is at least one.

7. The purge module jig of claim 1, wherein all portions of the gas transfer pipe is disposed in the opening.

8. The purge module jig of claim 1, wherein the fixing part is attached adjacent to the recessed groove.

9. A purge module comprising:
- a jig comprising a gas transfer pipe comprising a first end connected to an outside and a second end having a cassette contact part, a plate comprising an opening through which at least a portion of the gas transfer pipe is disposed, the opening being formed on an upper surface of the plate, and a fixing part fixing the gas transfer pipe to the plate;
- a gas control unit controlling a gas injected into a wafer cassette or discharged from the wafer cassette; and
- a pipe having one end connected to the first end of the gas transfer pipe and other end connected to the gas control unit,
- wherein the plate further comprises a recessed groove in which at least a portion of the gas transfer pine is disposed, the recessed groove being formed on the upper surface of the plate, and
- wherein the opening is connected to one end of the recessed groove.

10. The purge module of claim 9, wherein the cassette contact part comprises a packing member located on an upper surface of the cassette contact part and preventing gas leakage.

11. The purge module of claim 9, wherein a cross section of the gas transfer pipe has an elliptical shape.

12. The purge module of claim 9, wherein
the fixing part is attached adjacent to the recessed groove.

13. The purge module of claim 9, further comprising a connecting member to facilitate connection of the first end of the gas transfer pipe and the pipe.

* * * * *